United States Patent
Mushirahad et al.

(10) Patent No.: US 7,222,037 B2
(45) Date of Patent: May 22, 2007

(54) HYBRID AUTOMATIC GAIN CONTROL (AGC)

(75) Inventors: Venkat Chary Mushirahad, Santa Clara, CA (US); Sujan Thomas, Sunnyvale, CA (US); Rajanatha Shettigara, Sunnyvale, CA (US)

(73) Assignee: Genesis Microchip Inc., Santa Clara, CA (US)

( * ) Notice: Subject to any disclaimer, the term of this patent is extended or adjusted under 35 U.S.C. 154(b) by 0 days.

(21) Appl. No.: 11/202,417

(22) Filed: Aug. 10, 2005

(65) Prior Publication Data

US 2006/0089813 A1    Apr. 27, 2006

Related U.S. Application Data

(60) Provisional application No. 60/619,110, filed on Oct. 15, 2004.

(51) Int. Cl.
*G01R 35/00* (2006.01)
(52) U.S. Cl. ...................................... 702/107
(58) Field of Classification Search ................ 702/107
See application file for complete search history.

(56) References Cited

U.S. PATENT DOCUMENTS 4,213,097 A * 7/1980 Chiu et al. ................. 330/51
5,677,962 A * 10/1997 Harrison et al. ............ 381/109
2004/0075771 A1* 4/2004 Miyabayashi ............... 348/570

FOREIGN PATENT DOCUMENTS

GB    2 229 333    *    9/1990

* cited by examiner

*Primary Examiner*—Michael Nghiem
(74) *Attorney, Agent, or Firm*—Beyer Weaver LLP

(57) ABSTRACT

A method of automatic gain control in both analog and digital domain is performed by receiving an incoming analog signal, determining an overall gain factor, determining a coarse analog gain control value and a fine digital gain control value, each of which, when taken together substantially equals the already determined overall gain factor, modifying the incoming analog signal using the coarse analog gain control value to form a coarsely adjusted digital signal, digitizing the coarsely adjusted digital signal, and using the fine digital gain control value to process the coarsely adjusted digital signal to form an outgoing digital signal, wherein the outgoing digital signal has been modified in both the analog domain and subsequently in the digital domain to achieve an appropriate signal to noise ratio.

5 Claims, 4 Drawing Sheets

HYBRID AUTOMATIC GAIN CONTROL (AGC)

CROSS REFERENCE TO RELATED APPLICATIONS

The present application claims priority under 35 U.S.C. §119(e) from U.S. Provisional Patent Application No. 60/619,110 entitled "HYBRID AGC FOR VIDEO DECODER" filed Oct. 15, 2004, the entire disclosure of which is incorporated herein by reference for all purposes.

BACKGROUND

1. Field of the Invention

The invention describes a hybrid automatic gain control (AGC) method and apparatus suitable for normalizing (by attenuation or amplification) dynamic range of analog input signal.

2. Description of Related Art

In conventional automatic gain control (AGC) systems, an input analog signal is normalized in either the analog domain or the digital domain. Conventional AGC is performed by measuring a particular parameter of the input analog signal (i.e., the sync height of a composite video signal, for example) and based on that measurement, the desired gain is calculated and applied to the input signal. In the digital domain, AGC implemented using a feed-forward type arrangement whereas in the analog domain, a feedback system is employed. Although digital domain type AGC is inexpensive to implement and fast, the output signal can exhibit coarse granularity due to the discrete nature of the multiplication in the digital domain. Even though AGC in the analog domain is continuous in nature, analog AGC is costly to implement and is subject to a very slow response, or oscillations, when confronted with sudden changes in the input signal.

Therefore, what is desired is a cost effective, system, method, and apparatus for providing both fast and high resolution automatic gain control (AGC).

SUMMARY OF THE INVENTION

A method of automatic gain control in both analog and digital domain is described. The method is performed by receiving an incoming analog signal, determining an overall gain factor, determining a coarse analog gain control value and a fine digital gain control value. Each of which, when applied in cascade equals the already determined overall gain factor. The incoming analog signal coarsely normalized with the coarse analog gain control value is digitized. Coarsely adjusted digital signal, is digitally normalized using the fine digital gain control value to process the coarsely adjusted signal to form an outgoing digital signal, wherein the outgoing digital signal has been modified in both the analog domain and subsequently in the digital domain to maintain an appropriate signal to noise ratio.

In another embodiment, computer program product for providing automatic gain control in both analog and digital domain is described that includes computer code for receiving an incoming digitized signal for determining an overall gain factor to determine a coarse analog gain control value and a fine digital gain control value, each of which, when taken in cascade equals the already determined overall gain factor, computer code for modifying the incoming analog signal using the coarse analog gain control value to form a coarsely adjusted digital signal, computer code for using the fine digital gain control value to process the coarsely adjusted digital signal to form an outgoing digital signal, wherein the outgoing digital signal has been modified in both the analog domain and subsequently in the digital domain to maintain an appropriate signal to noise ratio, and computer readable medium for storing the computer code.

In still another embodiment, an apparatus is described that includes an interface for receiving an incoming analog signal, an overall gain determinator coupled to the interface arranged to determine an overall gain factor and to determine a coarse analog gain control value and a fine digital gain control value, each of which, when taken in cascade equals the already determined overall gain factor, an analog multiplier coupled to the overall gain determinator used to modify the incoming analog signal using the coarse analog gain control value to form a coarsely adjusted signal, an ADC for digitizing the coarsely adjusted signal, and a digital multiplier coupled to an output of the ADC arranged to use the fine digital gain control value to process the coarsely adjusted digital signal to form an outgoing digital signal, wherein the outgoing digital signal has been modified in both the analog domain and subsequently in the digital domain to maintain an appropriate signal to noise ratio.

DETAILED DESCRIPTION

Figure 1:
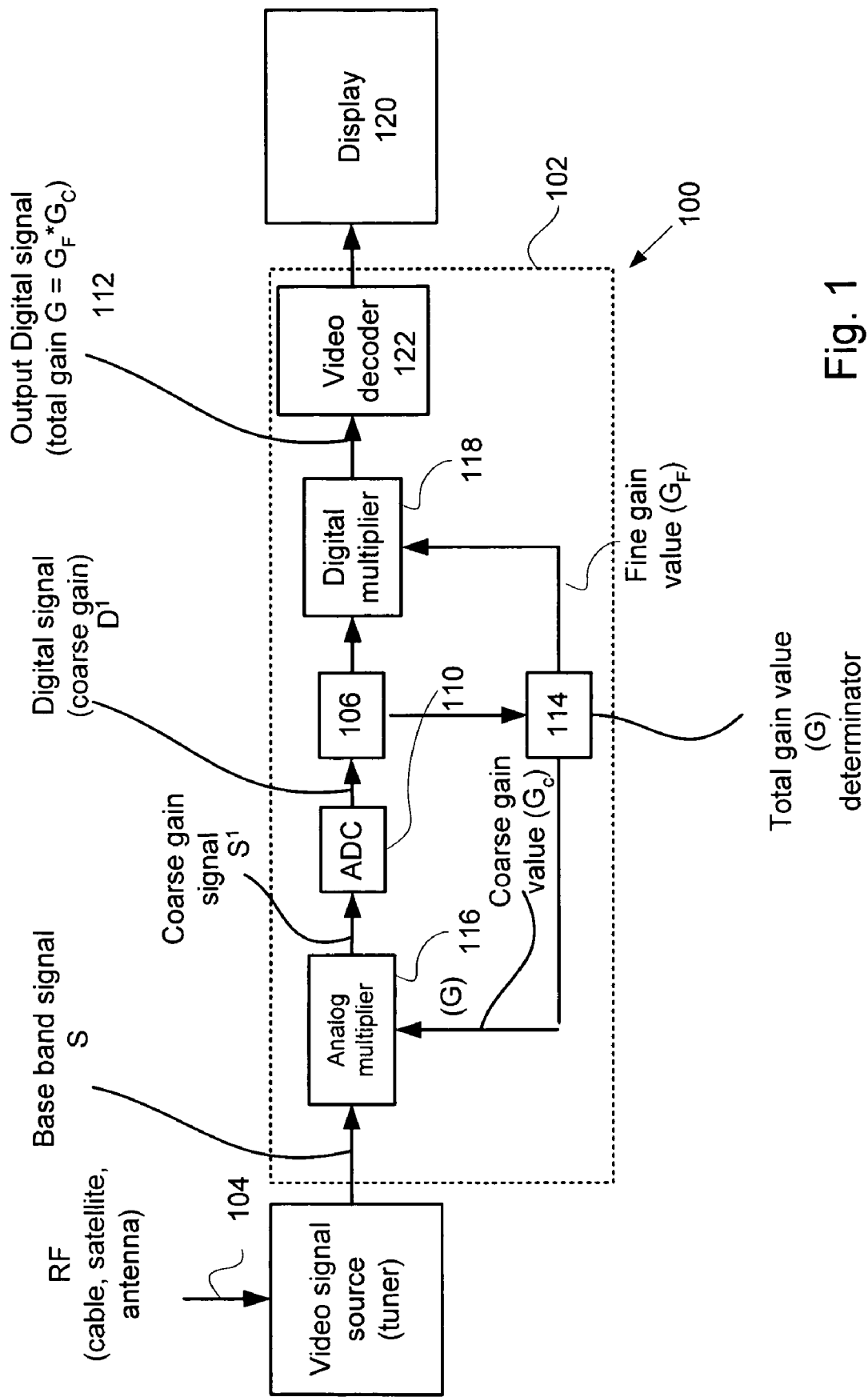
FIG. 1 shows a system 100 incorporating a particular implementation of a hybrid AGC in accordance with an embodiment of the invention.

Reference will now be made in detail to a particular embodiment of the invention an example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention.

In conventional automatic gain control (AGC) systems, AGC is accomplished by measuring particular characteristics of the input analog signal (i.e., the sync height of a composite video signal, for example) and based on that measurement, the desired gain is calculated and applied o the input signal. AGC can be performed in either the digital domain (which is inexpensive to implement and fast but subject to coarse resolution) or in the analog domain (which is capable of high resolution but is costly to implement and is subject to a very slow response, or oscillations, when confronted with sudden changes in the input signal, such as switching channels in a television system).

The inventive hybrid AGC system addresses these problems by providing an analog multiplication prior to an analog to digital converter (ADC) stage followed by a digital multiplication after the ADC stage both of which taken together provide the requisite gain factor. In this way, the analog multiplier stage provides the requisite coarse gain (and in so doing, the maximum precision) whereas the remaining gain adjustment is provided by the high resolution digital multiplier stage. In this way, the hybrid AGC system is able to maintain an overall multiplier resolution very accurately in spite of the fact that the analog multiplier stage is not particularly accurate (and can therefore be implemented in a cost effective manner). In addition, the hybrid AGC system is much more robust than conventional AGC systems since for small variations of input (within acceptable signal levels) the analog gain remains unchanged and digital multiplier is relied upon to maintain a steady signal amplitude.

By using this combination of both analog and digital multipliers, the problem of oscillations or slow response is effectively eliminated since the analog multiplier is invoked when ever there is a large gain (can be controlled in software based on the system requirement) change on input signal. This is implemented as an overdamped system to avoid oscillation. The digital multiplier (which responds relatively fast without oscillations, since it is a feed-forward system) momentarily takes care of sudden input changes until such time as the analog gain stabilizes at which time is shuts off. In this way, the full precision is always maintained.

It should also be noted that the response of the hybrid AGC is adaptive to different signal transitions in that it responds very fast for large transitions, and slower for small transitions to bring about a smoother non-flashy display. If the signal is oversaturated (it gets outside the measurement scope), the recovery is fast. This entire operation is done in firmware, which takes a very small load on a processor, since this is done once every few fields, with bare minimal processor cycles.

The invention will now be described in terms of a receiver having a hybrid AGC unit incorporated therein arranged to receive an analog signal typical of an analog television broadcast. However, it should be noted that the choice of the particular system used to implement the invention is exemplary only and should not be construed to limit either the scope or intent of the invention. Accordingly, the hybrid AGC described herein is well suited for any number and type of systems that receive and process analog signals.

Accordingly, FIG. 1 shows a system 100 incorporating a particular implementation of a hybrid AGC in accordance with an embodiment of the invention. The system 100 includes a receiver 102 arranged to receive an input analog signal 104. In the particular example of FIG. 1, the input analog signal 104 is an analog composite television signal shown in more detail in FIG. 2. Composite video (composite of three source signals called Y, U and V) is the format of an analog television signal before it is modulated onto an RF carrier usually in a standard format such as NTSC, PAL, or SECAM. As well known, Y represents the brightness or luminance of the picture and includes synchronizing pulses (Hsync, Vsync) and U and V between them carry the color information that first mixed with two orthogonal phases of a color carrier signal to form a signal called the chrominance. Y and UV are then added together. Composite video can easily be directed to any broadcast channel simply by mixing it with the proper RF carrier frequency. During the transmission (broad cast or cable or satellite) introduces several losses into the signal. Accordingly, the composite video signal 104 includes sync signal portions 202, a chrominance (UV) or color burst portion 204 that encodes the color, and a luminance (Y) portion 206 illustrated in FIG. 2.

An important consideration in the system 100 is the signal to noise (S/N) ratio of the signal 104 based upon the dynamic range of the incoming base-band single S. Since incoming signal strength can vary depending on a number of factors such as weather, the incoming dynamic range of the base-band signal S can as a result be degraded. In this way, if the dynamic range of the incoming base-band signal S is not normalized (i.e., gain), the resulting output digital signal can also be degraded resulting in a poor displayed image.

Referring again to FIG. 1, the receiver 102 includes a particular implementation of a hybrid automatic gain controller that includes an overall gain factor determinator unit 106 that determines an overall gain factor G required to meet the dynamic range of an ADC 110 used to convert the base band signal S into an output digital video signal 112 of appropriate format. It should be noted that the output digital video signal 112 can be any number and type of digital formats such as, SMPTE 274M-1995 (1920×1080 resolution, progressive or interlaced scan), SMPTE 296M-1997 (1280×720 resolution, progressive scan), as well as standard 480 progressive scan video.

Figure 2:
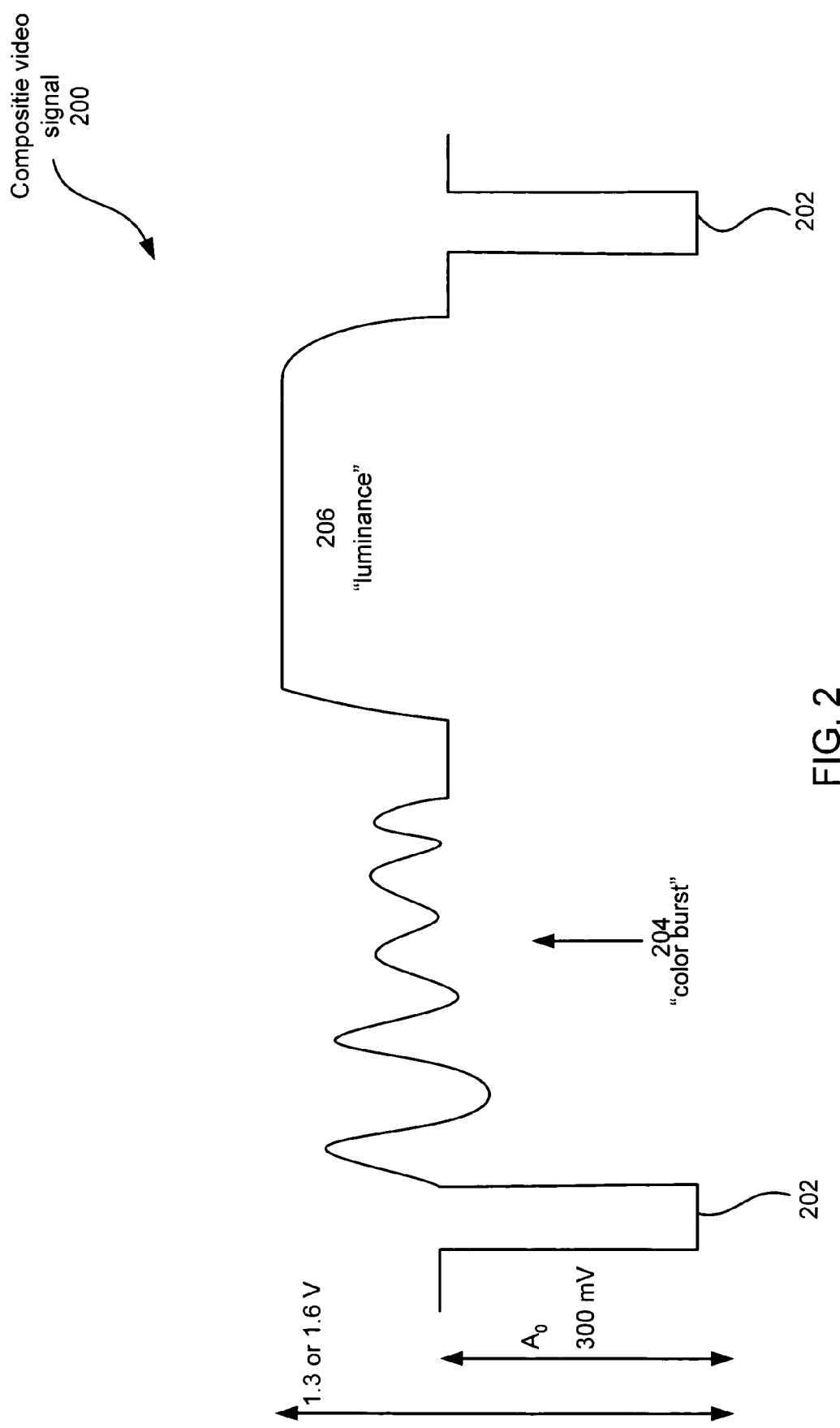
FIG. 2 shows a representative composite video signal.

Since the ADC 110 has to be able to handle a wide range of input analog dynamic ranges, the overall gain factor G is based upon the incoming signal using a selected parameter characteristic of the incoming signal (such as amplitude $A_0$ shown in FIG. 2). In the described embodiment, a hybrid automatic gain control (HyAGC) component 114 provides a coarse gain value $G_C$ to an analog multiplier unit 116 and a fine gain value $G_F$ to a digital multiplier unit 118 based upon the total gain value G provided by the overall gain factor determinator unit 106. The analog multiplier unit 116 provides a coarse gain adjustment of the incoming base band signal S to form a modified base band signal $S^1$ prior to the ADC 110 that then converts the modified input base band signal $S^1$ to a coarsely gain adjusted digital signal $D^1$. The coarsely gain adjusted digital signal $D^1$ is then processed by the digital multiplier unit using the fine gain value $G_F$ to form the output digital signal in accordance with the predetermined digital format. The output digital signal is then provided to a post processor.

Figure 3:
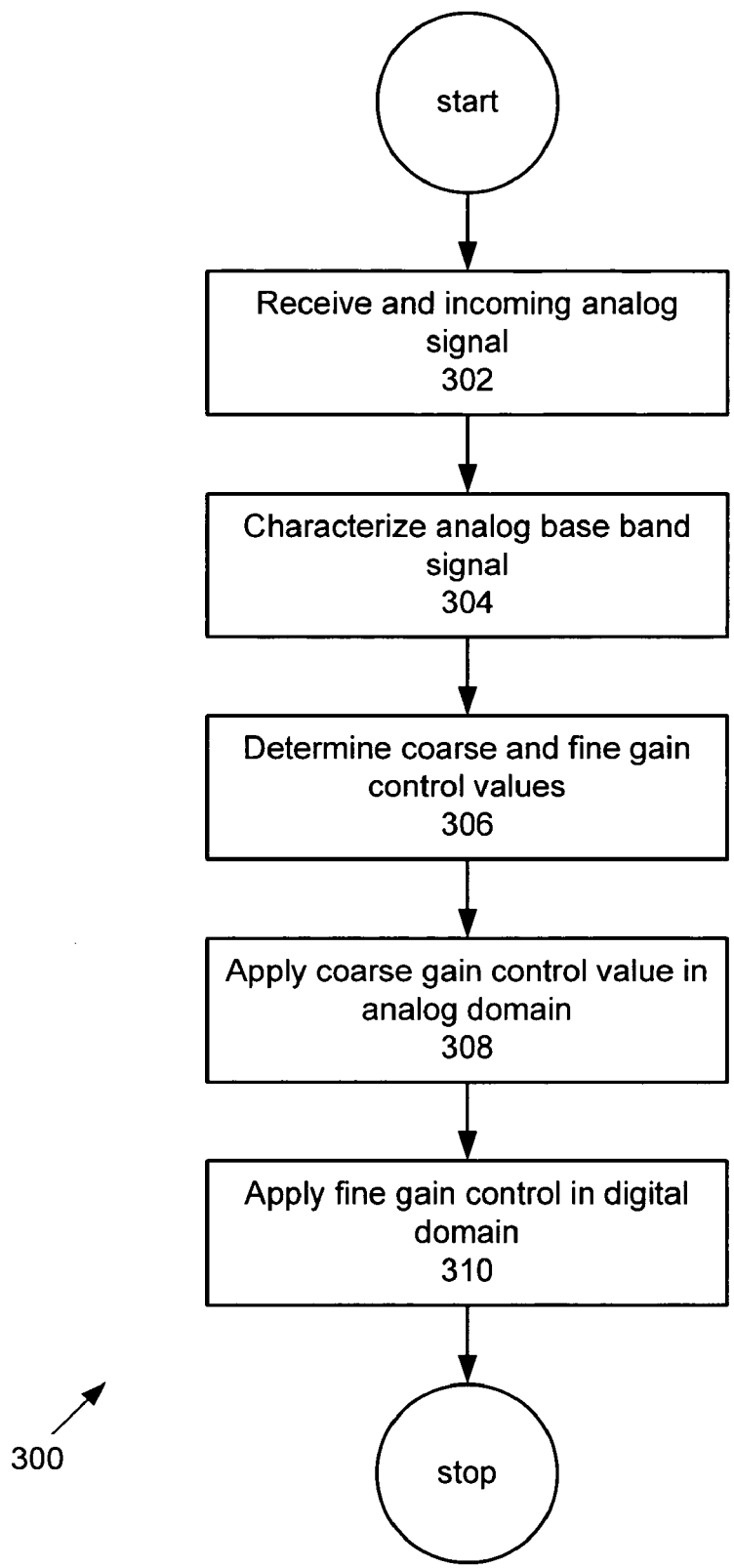
FIG. 3 shows a flowchart for a process for providing automatic gain control in both analog and digital domains in accordance with an embodiment of the invention.

FIG. 3 shows a flowchart detailing a process 300 for providing automatic gain control in accordance with an embodiment of the invention. The process 300 begins at 302 by receiving an incoming analog signal while at 304, an analog base band signal derived from the incoming signal is characterized in order to determine an overall gain factor. In the described embodiment, the overall gain factor is based upon requirements of an ADC unit used to digitize the analog base band signal. At 306, a hybrid automatic gain control unit determines a coarse analog gain control value and a fine digital gain control value, each of which, when applied in cascade equals the already determined overall gain factor. At 308, an analog multiplier uses the coarse analog gain control value to modify the incoming analog base band signal prior to digital conversion by the ADC unit that forms a coarsely adjusted digital signal. At 312, the coarsely adjusted digital signal is provided to a digital multiplier that uses the fine digital gain control value to process the coarsely adjusted digital signal to form an outgoing digital signal. In the described embodiment, the outgoing signal has been modified in both the analog domain and subsequently in the digital domain to achieve an appropriate signal to noise ratio.

Figure 4:
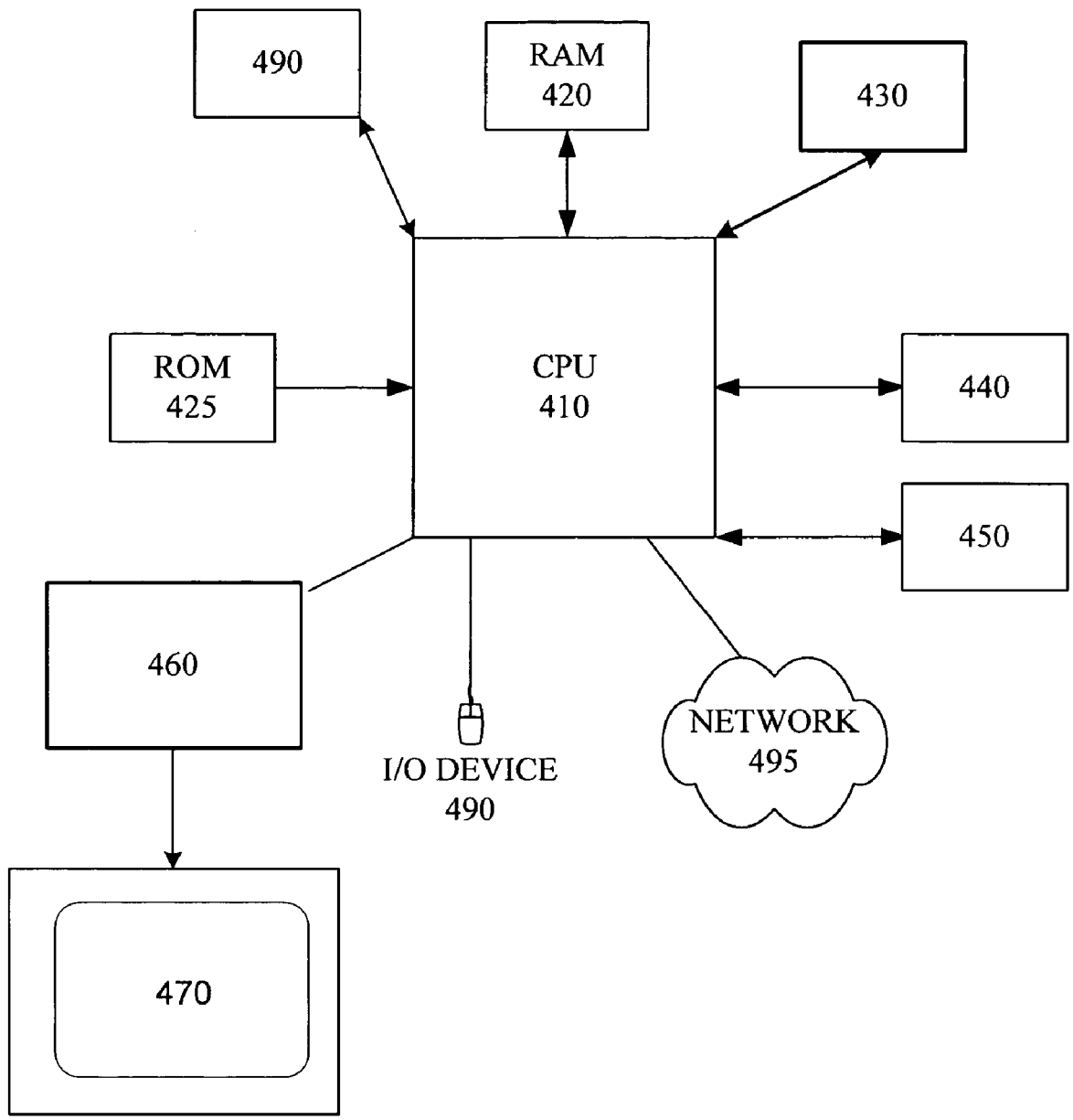
FIG. 4 illustrates a graphics system 400 in which the inventive circuit can be employed.

FIG. 4 illustrates a graphics system 400 in which the inventive circuit can be employed. System 400 includes central processing unit (CPU) 410, random access memory (RAM) 420, read only memory (ROM) 425, one or more peripherals 430, primary storage devices 440 and 450, graphics controller 460, and digital display unit 470. CPUs 410 are also coupled to one or more input/output devices 490 that may include, but are not limited to, devices such as, track balls, mice, keyboards, microphones, touch-sensitive displays, transducer card readers, magnetic or paper tape readers, tablets, styluses, voice or handwriting recognizers, or other well-known input devices such as, of course, other computers. Graphics controller 460 generates image data and a corresponding reference signal, and provides both to digital display unit 470. The image data can be generated, for example, based on pixel data received from CPU 410 or from an external encode (not shown). In one embodiment, the image data is provided in RGB format and the reference signal includes the $V_{SYNC}$ and $H_{SYNC}$ signals well known in the art. However, it should be understood that the present invention could be implemented with image, data and/or reference signals in other formats. For example, image data can include video signal data also with a corresponding time reference signal.

Although only a few embodiments of the present invention have been described, it should be understood that the present invention may be embodied in many other specific forms without departing from the spirit or the scope of the present invention. The present examples are to be considered as illustrative and not restrictive, and the invention is not to be limited to the details given herein, but may be modified within the scope of the appended claims along with their full scope of equivalents.

While this invention has been described in terms of a specific embodiment, there are alterations, permutations, and equivalents that fall within the scope of this invention. It should also be noted that there are many alternative ways of implementing both the process and apparatus of the present invention. It is therefore intended that the invention be interpreted as including all such alterations, permutations, and equivalents as fall within the true spirit and scope of the present invention.

We claim:

1. An apparatus, comprising:
   an interface for receiving an incoming analog signal;
   an overall gain determinator coupled to the interface arranged to determine an overall gain factor and an automatic gain controller to determine a coarse analog gain control value and a fine digital gain control value, each of which, applied in cascade equals the already determined overall gain factor;
   an analog multiplier coupled to the overall gain determinator used to modify the incoming analog signal using the coarse analog gain control value to form a coarsely adjusted digital signal;
   an analog to digital converter (ADC) coupled to the overall gain determinator for digitizing the coarsely adjusted digital signal; and
   a digital multiplier coupled to an output of the ADC arranged to use the fine digital gain control value to process the coarsely adjusted digital signal to form an outgoing digital signal, wherein the outgoing digital signal has been modified in both the analog domain and subsequently in the digital domain to achieve an appropriate signal to noise ratio.

2. An apparatus as recited in claim 1, wherein the determining an overall gain factor is based upon a predetermined characteristic of the analog signal.

3. An apparatus as recited in claim 2, wherein the predetermined characteristic is a video amplitude parameter.

4. An apparatus as recited in claim 1 further comprising:
   a means for generating an analog base band signal from the incoming analog signal.

5. An apparatus as recited in claim 4, wherein the overall gain factor is further based upon the dynamic range of an analog to digital converter unit used to digitize the analog base band signal.

* * * * *